US006791838B1

(12) United States Patent
Hung et al.

(10) Patent No.: US 6,791,838 B1
(45) Date of Patent: Sep. 14, 2004

(54) FLEXIBLE ASSEMBLY SYSTEM AND MECHANISM ADAPTED FOR AN OPTICAL PROJECTION APPARATUS

(75) Inventors: Min-Hsiung Hung, Chia I (TW); Hua-Shing Chen, Ping Tung (TW); Yin-Fa Tu, Chung Li (TW)

(73) Assignee: Lite-On Technology Corporation, Taipei (TW)

( * ) Notice: Subject to any disclaimer, the term of this patent is extended or adjusted under 35 U.S.C. 154(b) by 0 days.

(21) Appl. No.: 10/459,457

(22) Filed: Jun. 12, 2003

(30) Foreign Application Priority Data

Mar. 7, 2003 (TW) ........................................ 92203530 U

(51) Int. Cl.⁷ ................................................ H05K 7/20

(52) U.S. Cl. ........................ 361/704; 361/707; 361/718; 361/719; 257/706; 257/718; 257/727; 165/80.3; 165/185; 174/16.1; 174/16.3

(58) Field of Search ............................. 361/704, 718, 361/719; 257/706, 718, 727; 165/80.3, 185; 174/16.1, 16.3

(56) References Cited

U.S. PATENT DOCUMENTS

| | | | | |
|---|---|---|---|---|
| 6,256,199 B1 | * | 7/2001 | Yusuf et al. | ................. 361/699 |
| 6,477,058 B1 | * | 11/2002 | Luebs et al. | ................. 361/784 |
| 6,545,879 B1 | * | 4/2003 | Goodwin | .................... 361/807 |
| 6,549,418 B1 | * | 4/2003 | Deeney | ....................... 361/736 |
| 6,611,431 B1 | * | 8/2003 | Lee et al. | .................... 361/719 |
| 6,614,659 B2 | * | 9/2003 | Feigenbaum et al. | ....... 361/719 |

* cited by examiner

*Primary Examiner*—Boris Chervinsky
(74) *Attorney, Agent, or Firm*—Birch, Stewart, Kolasch & Birch, LLP

(57) ABSTRACT

A flexible assembly system and mechanism adapted for optical projection apparatus, the flexible assembly system includes a flexible element, a heat-sink element, a digital micro-mirror device module, an optical holder and a locked element, wherein the locked element is serially connected the flexible element, the heat-sink element, the digital micro-mirror device module and the optical holder, for making each element be formed in one-piece, whereby using the flexible element to eliminate the accumulative tolerance between each assembly element, and producing a compact combination between the heat-sink element and the digital micro-mirror device module, so that the digital micro-mirror device module has a best heat dissipating effect.

12 Claims, 4 Drawing Sheets

FLEXIBLE ASSEMBLY SYSTEM AND MECHANISM ADAPTED FOR AN OPTICAL PROJECTION APPARATUS

FIELD OF THE INVENTION

The present invention relates to a flexible assembly system and mechanism adapted for using on an optical projection apparatus, especially to a flexible assembly mechanism for assembling with a heat-sink element and a digital micro-mirror device module on an optical holder of the optical projection apparatus.

BACKGROUND OF THE INVENTION

With the information generation, and the development of the optical and projection display technology, the digital projection device with high dot per inch and pixel can be used on the briefing, meeting, conference or training, even become the important apparatus in the family amusement. Hence, the digital projection apparatus with high image quality and brightness, light volume, reasonable price and service are important indexes for consumers.

With regard to the technology principle, there are two types of digital projection apparatuses, which are liquid crystal display (LCD) and digital light processor (DLP), respectively. Wherein the DLP is a reflecting projection technology, and a digital micro-mirror device (DMD) is the important element in the DLP for forming the image, the DMD chips compose of a plurality of the micro mirrors, and through the control board to control the deflection angle and the deflection time each of the micro mirrors, for adjusting the reflective direction of light, than through the lens to project the image.

In general, in the DLP projection system, the assembly with heat-sink element, the DMD module (which comprises a control board and a DMD) and the optical holder will generate an accumulative tolerance, to limit the arrangement of the heat-sink element in the DLP projection system, and the compact combination between the heat-sink element and the DMD module occur overpressure to damage the DMD, moreover using the light source of big power to make the l)LP projection obtain high light, to increase the volume and power consumption of DLP projection, so that it is an important question of heat dissipation on DLP projection system. In the present DLP projection system, it is very important topic to design the assembly between the DMD and the heat-sink element, for reducing the cost and increasing the heat dissipating effect.

SUMMARY OF THE INVENTION

The primary object of the present invention is to provide a flexible assembly system and mechanism adapted for using on an optical projection apparatus, wherein a flexible element eliminates the accumulative tolerance between each assembly element, for providing a compact combination between the heat-sink element and the DMD, so that the DMD can obtain a best heat dissipating effect.

Another object of the present invention is to provide a flexible assembly system and mechanism adapted for using on an optical projection apparatus, wherein the flexible element provides a suitable pressure on a rear of the DMD, to avoid the assembly pressure too large so as to damage the DMD.

In order to achieve the above objects, the present invention provides a flexible assembly system and mechanism adapted for using on an optical projection apparatus, for assembling with a heat-sink element and a DMD module on an optical holder of the optical projection apparatus, wherein the flexible assembly mechanism comprises a flexible element, a first fixed element arranged on the DMD module, a second fixed element arranged on the optical holder and a locked element serially connected with the flexible element, the first fixed element and the second fixed element, for assembling the heat-sink element, the DMD module and the optical holder in one-piece.

The various objects and advantages of the present invention will be more readily understood from the following detailed description when read in conjunction with the appended drawing, in which:

BRIEF DESCRIPTION OF DRAWING

FIG. I is an exploded view of according to a first embodiment of the present invention.

DETAILED DESCRIPTION OF THE PREFERRED EMBODIMENT

Figure 1:
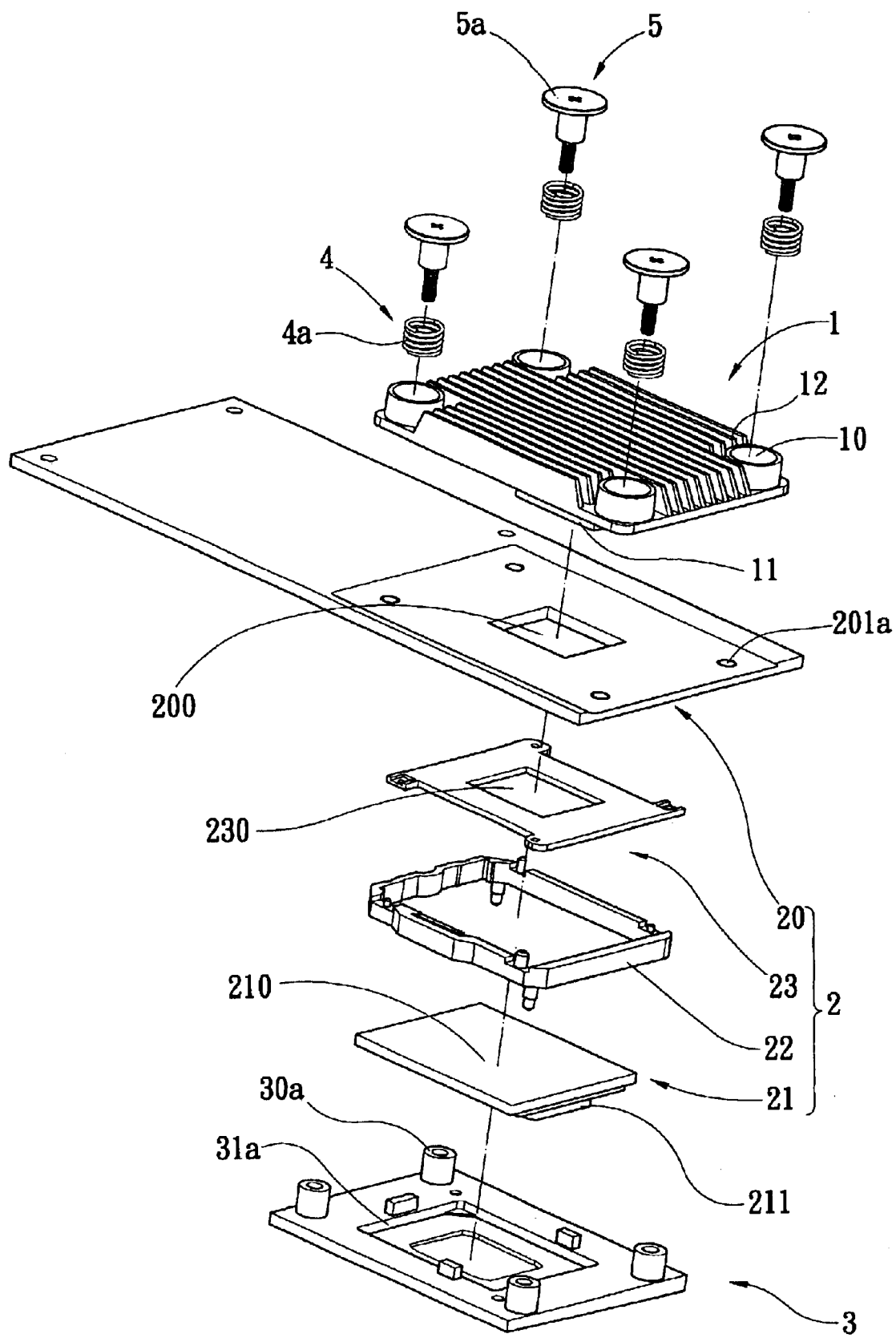

Referring now to FIG. 1, an exploded view of according to a first embodiment of the present invention, which comprises a heat-sink element 1, a DMD module 2, an optical holder 3, a flexible element 4 and a locked element 5.

The heat-sink element I has a plurality of receiving holes 10 formed therearound and a heat conduction body 11 protruded thereunder, the heat conduction body 11 assembled or integrally formed on a heat-sink fin 12 of the heat-sink element 1, wherein the DMD module 2 has a control board 20, a DMD 21, a fixed holder 22 arranged around the DMD and a upon cover 23 can transform the information from the control board 20 to the DMD 21, wherein the control board 20 has an opening 200 and a first fixed element (which is a plurality of through holes 201a) formed therearound, wherein the upon cover 23 has an opening 230 be matched up the heat conduction body 11 of the heat-sink element 1, the heat conduction body 11 of the heat-sink element 1 is disposed through the opening 200 of the control board 20 to touch the rear of the DMD 21, for controlling the angular change of a plurality of micro mirrors 211 of DMD21.

The optical holder 3 has a second fixed element (which is a plurality of assembly holes 30a) arranged thereon, and an assembly interface 31a adapted for assembling the DMD module 2 therein, the flexible element 4 disposed in the receiving hole 10 of the heat-sink element 1, and the flexible element 4 has a plurality of compressing springs 4a or element with providing pressure by deformation of elasticity and plasticity, and the locked element 5 can be a plurality of screw bolts 5a.

Figure 2:
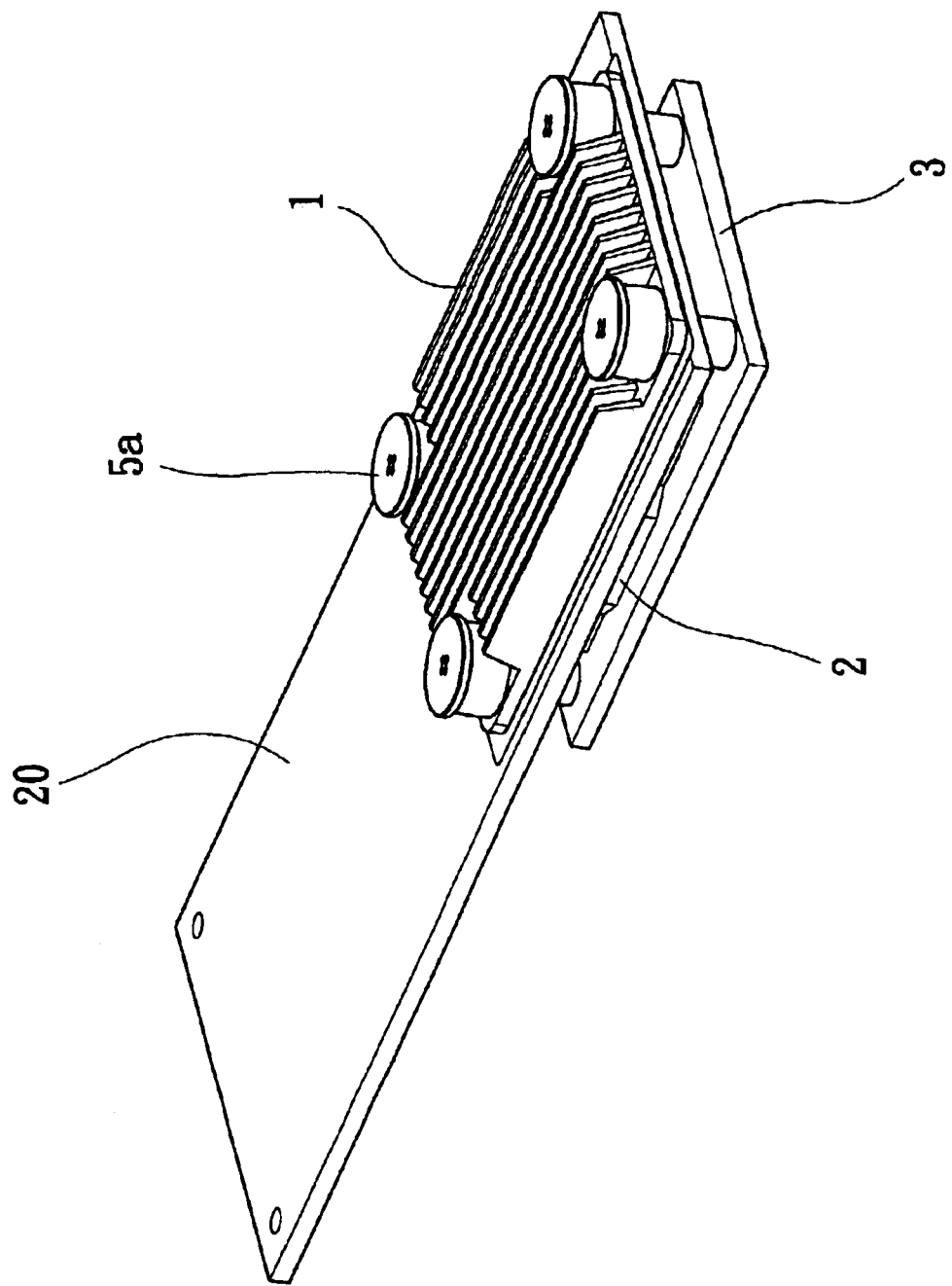
FIG. 2 is a perspective view of according to a first embodiment of the present invention.
Figure 3:
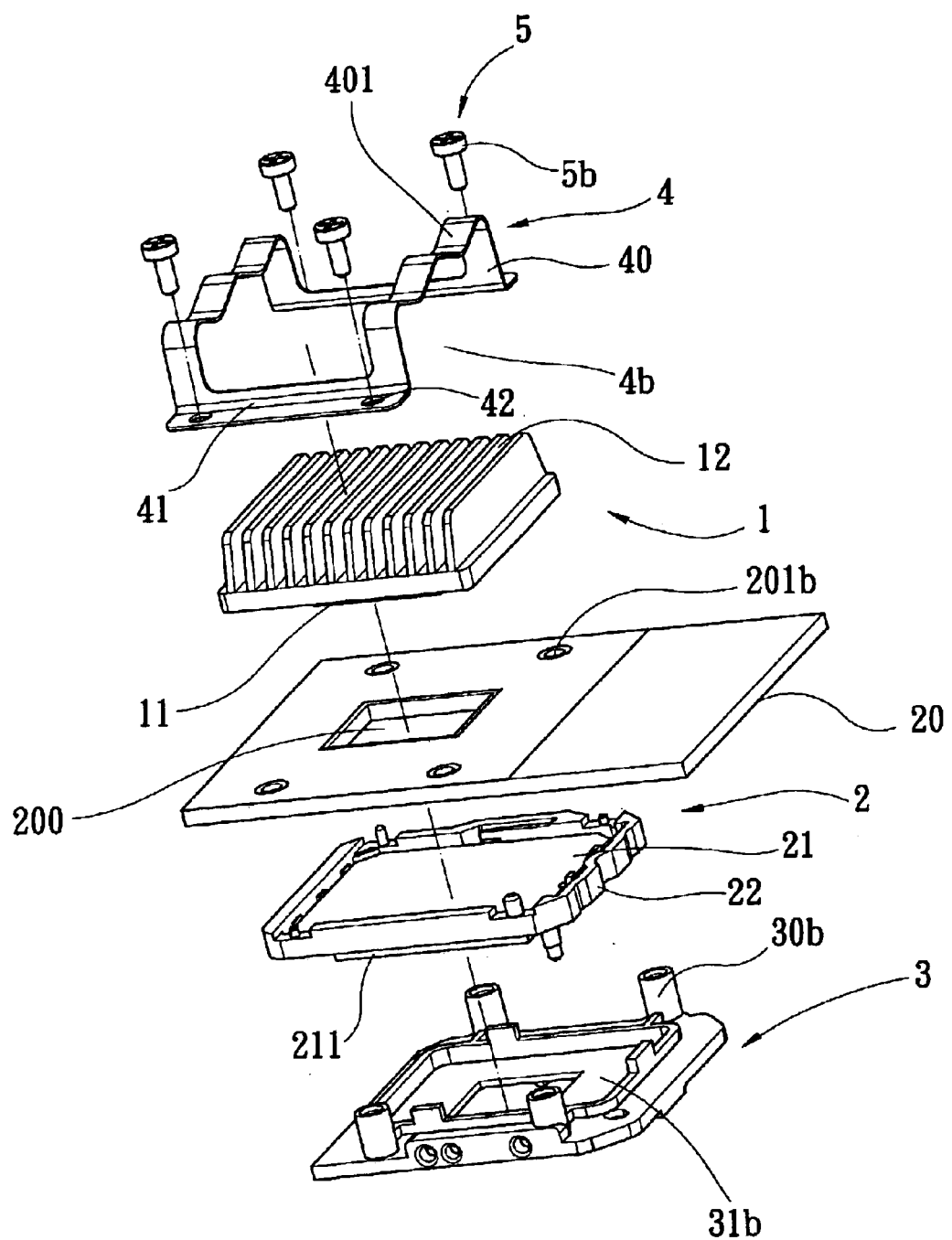
FIG. 3 is an exploded view of according to a second embodiment of the present invention.

Referring now to FIG. 2, a perspective view of according to a first embodiment of the present invention, the plurality of screw bolts 5a are serially connected with the compressing springs 4a, the receiving holes 10 of the heat-sink element 1, the through holes 201a of the DMD module 2 and the assembly holes 30 of the optical holder 3, for assembling the heat-sink element 1, the DMD module 2 and the optical holder 3 in one-piece. Referring now to FIG. 3, an exploded view of according to a second embodiment of the present invention, which comprises a heat-sink element 1, a DMD module 2, an optical holder 3, a flexible element 4 and a locked element 5.

The heat-sink element 1 has a heat conduction body 11 protruded thereunder, the heat conduction body 11 assembled or integrally formed on a heat-sink fin 12 of the heat-sink element 1, the DMD module 2 has a control board 20, a DMD 21, a fixed holder 22 arranged around the DMD 21 and a upon cover 12 can transform the information from the control board 20 to the DMD 21, the control board 20 has an opening 200, and a first fixed element (which can be a plurality of through holes 201*b*) is arranged therearound, wherein the heat conduction body 11 of the heat-sink element 1 is disposed through the opening 200 of the control board 20 to touch the rear of the DMD 21, for controlling the angular change of a plurality of micro mirrors 211 of DMD 21.

The optical holder 3 has a second fixed element (which is a plurality of assembly holes 30*b*) arranged thereon, and an assembly interface 31*a* is adapted for assembling the DMD module 2 therein, the flexible element 4 is disposed in the receiving hole 10 of the heat-sink element 1, the flexible element 4 can be a plurality of plate springs 4*b*, or element with providing pressure by deformation of elasticity and plasticity, wherein the plate spring 4*b* is disposed on the heat-sink element 1, the plate spring 4*b* has a vaulting portion 40 and an extended section 41 horizontally extended from a terminal end of the vaulting portion 40, and a plurality of fixed holes 42 is disposed on the extended section 41, and the locked element 5 can be a plurality of screw bolts 5*b*.

Figure 4:
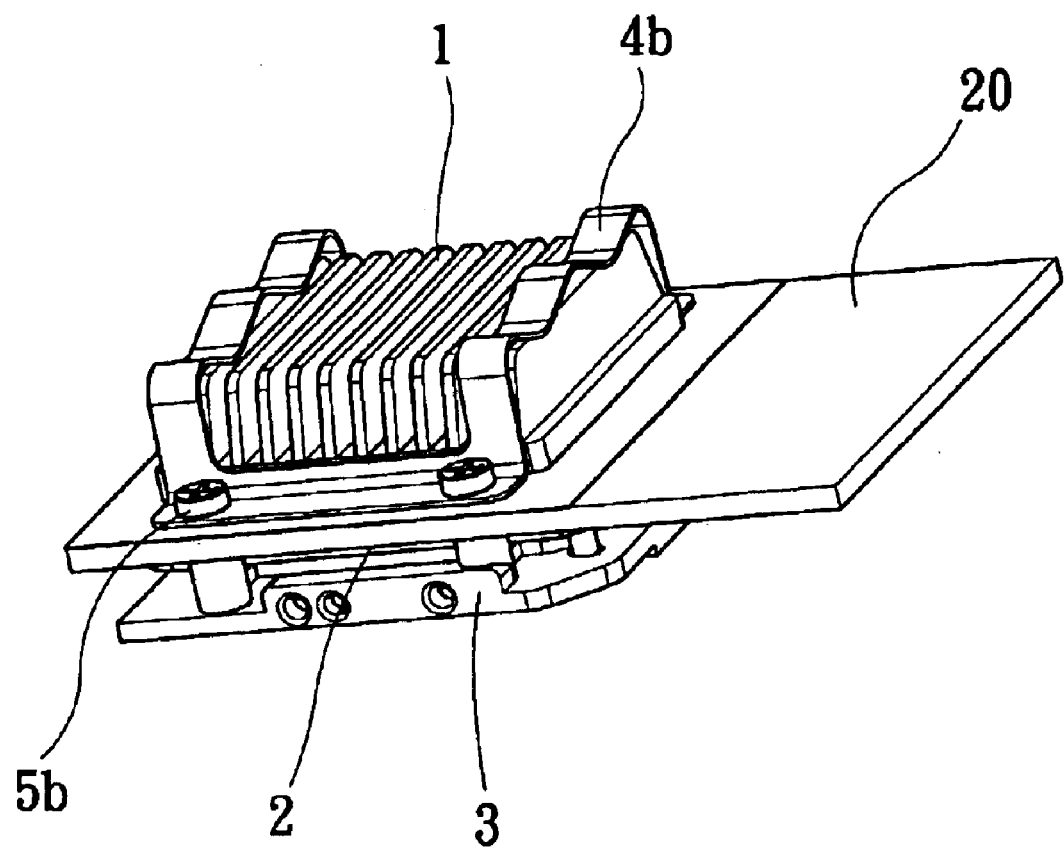
FIG. 4 is a perspective view of according to a second embodiment of the present invention.

Referring now to FIG. 4, a perspective view of according to a second embodiment of the present invention, the plurality of screw bolts 5*b* are serially connected with the plate spring 4*b*, the through hole 201*b* of the DMD module 2 and the assembly hole 30 of the optical holder 3, for assembling the heat-sink element 1, the DMD module 2 and the optical holder 3 in one-piece.

To sum up, the present invention discloses the flexible element 4 for eliminating the accumulative tolerance between each element, and producing a compact combination between the heat-sink element 1 and the DMD module 2, so that the DMD module 2 has a best heat dissipating effect, moreover using the flexible element 4 to provide a suitable pressure on the rear portion 210 of the DMD 21, to avoid the assembly pressure too large so as to damage the DMD 21.

Although the present invention has been described with reference to the preferred embodiment thereof, it will be understood that the invention is not limited to the details thereof. Various substitutions and modification have suggested in the foregoing description, and other will occur to those of ordinary skill in the art. Therefore, all such substitutions and modifications are intended to be embraced within the scope of the invention as defined in the appended claims.

What is claimed is:

1. A flexible assembly mechanism adapted for an optical projection apparatus, for assembling with a heat-sink element and a digital micro-mirror device module on an optical holder of the optical projection apparatus, the flexible assembly mechanism comprising:

a flexible element;

a first fixed element arranged on the digital micro-mirror device module;

a second fixed element arranged on the optical holder; and a locked element being serially connected with the flexible element, the first fixed element and the second fixed element, for assembling the heat-sink element, the digital micro-mirror device module and the optical holder in one-piece.

2. The flexible assembly mechanism as claimed in claim 1, wherein the heat-sink element has a plurality of receiving holes formed therearound.

3. The flexible assembly mechanism as claimed in claim 2, wherein the flexible element is a plurality of compressing springs respectively disposed in the receiving holes of the heat-sink element.

4. The flexible assembly mechanism as claimed in claim 1, wherein the flexible element is a plate spring having a plurality of fixed holes.

5. The flexible assembly mechanism as claimed in claim 1, wherein the first fixed element is a plurality of through holes formed around the digital micro-mirror device module.

6. The flexible assembly mechanism as claimed in claim 1, wherein the second fixed element is a plurality of assembly holes formed around the optical holder.

7. The flexible assembly mechanism as claimed in claim 1, wherein the locked element is a plurality of screw bolts.

8. A flexible assembly system adapted for optical projection apparatus, which comprises:

a heat-sink element having a plurality of receiving holes formed therearound and a heat conduction body being protruded thereunder;

a digital micro-mirror device module having a control board and a digital micro-mirror device, the control board having an opening, and a plurality of through holes formed therearound, the heat conduction body of the heat-sink element being disposed through the opening of the control board, for contacting the rear of the digital micro-mirror device;

an optical holder having a plurality of assembly holes being arranged on the optical holder, and an assembly interface being adapted for assembling the digital micro-mirror device module therein;

a plurality of compressing springs respectively disposed in the receiving holes of the heat-sink element; and a plurality of screw bolts being serially connected with the compressing spring, the receiving hole of the heat-sink element, the through hole of the digital micro-mirror device module and the assembly hole of the optical holder, for assembling the heat-sink element, the digital micro-mirror device module and the optical holder in one-piece.

9. The flexible assembly system as claimed in claim 8, wherein the heat conductor body of the heat-sink element being integrally formed on a plurality of heat-sink fins of the heat-sink element.

10. A flexible assembly system adapted for optical projection apparatus, which comprises:

a heat-sink element having a heat conduction body being protruded thereunder;

a digital micro-mirror device module having a control board and a digital micro-mirror device, the control board having an opening, and a plurality of through holes being arranged therearound, the heat conduction body of the heat-sink element being disposed through the opening of the control board, for touching the rear of the digital micro-mirror device;

an optical holder having a plurality of assembly holes being arranged thereon, and an assembly interface being adapted for assembling the digital micro-mirror device module therein;

a plate spring being disposed on the heat-sink element; and a plurality of screw bolts being serially connected with the plate spring, the through hole of the digital micro-mirror device module and the assembly hole of the optical holder, for assembling the heat-sink element, the digital micro-mirror device module and the optical holder in one-piece.

11. The flexible assembly system as claimed in claim 10, wherein the plate spring has a vaulting portion and an extended section being horizontally extended from a terminal end of the vaulting portion, and a plurality of fixed holes formed on the extended section.

12. The flexible assembly system as claimed in claim 10, wherein the heat conductor body of the heat-sink element being integrally formed on a plurality of heat-sink fins of the heat-sink element.

* * * * *